US00RE39975E

(19) United States
(12) Reissued Patent
Kadota

(10) Patent Number: US RE39,975 E
(45) Date of Reissued Patent: Jan. 1, 2008

(54) SURFACE ACOUSTIC WAVE DEVICE AND COMMUNICATION DEVICE

(75) Inventor: Michio Kadota, Kyoto (JP)

(73) Assignee: Murata Manufacturing Co., Ltd., Kyoto (JP)

(21) Appl. No.: 10/813,690

(22) Filed: Mar. 31, 2004

Related U.S. Patent Documents

Reissue of:
(64) Patent No.: 6,366,002
Issued: Apr. 2, 2002
Appl. No.: 09/654,113
Filed: Aug. 31, 2000

(30) Foreign Application Priority Data

Sep. 2, 1999 (JP) ..... 11-248903

(51) Int. Cl.
*H03H 9/15* (2006.01)

(52) U.S. Cl. ..... 310/313 A; 310/313 R
(58) Field of Classification Search ..... 310/313 A, 310/313 R
See application file for complete search history.

(56) References Cited

U.S. PATENT DOCUMENTS

| | | | | |
|---|---|---|---|---|
| 4,001,767 A | | 1/1977 | Slobodnik, Jr. | 310/313 A |
| 5,081,389 A | | 1/1992 | Abbott et al. | 310/313 A |
| 5,283,037 A | * | 2/1994 | Baer et al. | 422/82.01 |
| 5,302,788 A | | 4/1994 | Link et al. | |
| 5,302,877 A | | 4/1994 | Sato et al. | 310/313 A |
| 5,760,522 A | | 6/1998 | Kobayashi et al. | 310/313 A |
| 5,854,527 A | | 12/1998 | Shimizu et al. | 310/313 A |
| 5,874,869 A | | 2/1999 | Ueda et al. | 333/193 |
| 5,914,645 A | | 6/1999 | Kobayashi et al. | |
| 6,037,699 A | | 3/2000 | Kobayashi et al. | 333/193 |
| 6,037,847 A | | 3/2000 | Ueda et al. | |
| 6,556,104 B2 | | 4/2003 | Naumenko et al. | 333/193 |

FOREIGN PATENT DOCUMENTS

| | | | | |
|---|---|---|---|---|
| EP | 0 353 073 A2 | | 1/1990 | |
| EP | 0 734 120 A1 | | 9/1996 | |
| GB | 2 244 880 A | | 12/1991 | |
| GB | 2 288 503 A | | 10/1995 | |
| JP | 06-164306 A | | 6/1994 | |
| JP | 08-316781 | | 11/1996 | |
| JP | 08-340234 | | 12/1996 | |
| JP | 09-018272 A | | 1/1997 | |
| JP | 9-153757 A | * | 6/1997 | 310/313 A |
| JP | 09-167936 | | 6/1997 | |
| JP | 090018272 A | * | 9/1997 | |
| JP | 09-331229 | | 12/1997 | |
| JP | 10-247835 | * | 9/1998 | |
| JP | 10-335965 A | * | 12/1998 | 310/313 A |
| JP | 2001-77662 A | * | 3/2001 | 310/313 A |
| JP | 2001-355692 A | * | 5/2001 | 310/313 A |

OTHER PUBLICATIONS

Koskela et al., "Suppression of the Leak Saw Attentuation With Heavy Mechanical Loading" IEEE Transactions on Ultrasonics, Ferroelectrics, and Frequency Control, vol. 45, No. 2, Mar. 1998, pp. 439–449.

Kobayashi et al., "1.9 GHz–Band Surface Acoustic Wave Device Using Second Leaky Wave on $LiTaO_3$and $LiNbO_3$" 1996 IEEE International Frequency Control Symposium, Jun. 1996, pp. 240–247.

(Continued)

*Primary Examiner*—Thomas M. Dougherty
(74) *Attorney, Agent, or Firm*—Keating & Bennett, LLP

(57) ABSTRACT

A surface acoustic wave device including a $LiTaO_3$ substrate, and an interdigital transducer is provided on the $LiTaO_3$ substrate. The interdigital transducer includes as a major component at least one of Au, Ag, Ta, Mo, Cu, Ni, Cr, Zn, and W, and the interdigital transducer has a normalized film thickness H/λ of approximately 0.05 or less so as to excite a shear horizontal wave.

29 Claims, 10 Drawing Sheets

OTHER PUBLICATIONS

Isobe et al., "Propagation Characteristics of Longitudinal Leaky Saw in Al–Grating Structure" 1997 IEEE Ultrasonics Symposium, Oct. 1997, pp. 17–21.

Knuuttila et al., "Asymmetric Acoustic Radiation in Leaky Saw Resonators on Lithium Tantalate" 1999 IEEE Ultrasonics Symposium, Oct. 1999, pp. 83–86.

English translatiaons of Official Communication issued in the corresponding Japanese Application No. 1999–248903 dated Aug. 20, 2002, and response to Official Communication dated Oct. 21, 2002.

English translations of Official Communication issued in the corresponding German Application No. 100 42 915.7 dated Oct. 17, 2002, and response to Official Communication dated Nov. 4, 2002.

Official Communication issued in the corresponding Korean Application No. 10–2000–0051516 dated Mar. 30, 2002, and English translation of response to Official Communication.

English translation of Official Communication issued in the corresponding Taiwanese Application No. 89117151 dated Nov. 19, 2001 and response to Official Communication.

Official Communication issued in the corresponding GB Application No. 0021214.2 dated Mar. 8, 2001, and response to Official Communication dated Jul. 6, 2001.

* cited by examiner

SURFACE ACOUSTIC WAVE DEVICE AND COMMUNICATION DEVICE

Matter enclosed in heavy brackets [ ] appears in the original patent but forms no part of this reissue specification; matter printed in italics indicates the additions made by reissue.

*The present application is the parent application of U.S. patent application Ser. No. 10/831,108, filed Apr. 26, 2004, which is currently pending and is also a Reissue Application of U.S. Pat. No 6,366,002, issued Aug. 31, 2000.*

BACKGROUND OF THE INVENTION

1. Field of the Invention

The present invention relates to a surface acoustic wave device such as a surface acoustic wave resonator, a surface acoustic wave filter, a sharing device, or other suitable device, and more particularly, to a surface acoustic wave device which uses a Shear Horizontal wave ("SH wave").

2. Description of the Related Art

Conventionally, surface acoustic wave devices have been widely used as band-pass filters for use in mobile communication equipment. One such conventional surface acoustic wave devices include a surface acoustic wave resonator having an IDT (interdigital transducer) composed of interdigital electrodes having electrode fingers interdigitated with each other, the IDT being disposed on a piezoelectric substrate, and a surface acoustic wave filter using the surface acoustic wave resonator.

In such a surface acoustic wave device, a technique is known in which a leaky surface acoustic wave having a large attenuation which propagates in a Y-X $LiTaO_3$ substrate with Euler angles (0°, −90°, 0°) as a piezoelectric substrate is converted to a Love wave type surface acoustic wave having no propagation loss by providing an IDT having a predetermined thickness and made of a metal having a large mass load such as Au, Ta, W, or other suitable metal.

FIG. 11 is a graph showing the variation of the electromechanical coupling coefficient k with the film thickness H/λ of Au electrodes (electrode film thickness/wavelength of excited surface acoustic wave), when the Au electrodes are provided on an $LiTaO_3$ substrate of Y cut X propagation type, that is, having Euler angles of (0°, −90°, 0°).

As shown in FIG. 11, a leaky surface acoustic wave is produced when the film thickness H/λ of the Au electrodes 0.03 or less. In the range of H/λ of at least 0.004, a Love wave is produced. FIG. 12 is a characteristic graph showing the propagation loss (attenuation constant) of the leaky surface acoustic wave under the same conditions as those of FIG. 11. The solid line represents the propagation loss when the electrodes are in the electrical short-circuiting state, and the dotted line represents the propagation loss when the electrodes are in the open-circuiting state. As shown in FIG. 12, in the electrical short-circuiting state, the propagation loss is zero in the range of H/λ of about at least 0.033, and in the electrical open-circuiting state, the propagation loss is zero in the range of H/λ of about at least 0.044. Accordingly, to use an SH type surface acoustic wave having no propagation loss, the thickness H/λ of the Au electrodes in the electrical short-circuiting state is required to be at least 0.033, depending on the metalization ratio of the IDT. Further, for material such as Ta, W or other suitable material having a lower density than Au, the thickness H/λ must be more than 0.033.

However, as the thickness of IDT increases, the production accuracy decreases. Accordingly, a sufficiently large thickness cannot be achieved. Unless the film thickness is adequately large, for example, the thickness H/λ is at least 0.033 for the Au electrodes, a propagation loss of zero cannot be achieved.

On the other hand, the film thickness H/λ (electrode thickness/excited SH wavelength) at which the electrode fingers of an IDT can be made with general accuracy is up to 0.05.When the propagation loss is desired to be zero, the film thickness H/λ is required to be at least 0.033. Thus, the range of the film thickness where the electrode fingers of IDT can be formed with high accuracy is very narrow.

Further, if an IDT is formed of an electrode material having a slightly lower density than Au, such as Ta or W, the thickness of the electrodes must be further increased as compared with that of the Au electrodes. Thus, the propagation loss cannot be reduced to zero in the range of film thickness in which the film can be accurately formed.

Regarding materials such as Au having a considerably higher density as compared with electrodes materials generally used in the IDTs of surface acoustic wave devices such as Al, the frequencies differ with even slight variations in film thickness, electrode finger width, and electrode finger pitch of the IDTs. Thus, after the IDTs are formed, the frequencies are conditioned by trimming the IDTs. However, when an IDT is formed from Au so as to have H/λ of about 0.034, as an example, but the frequency is less than a desired value, such a frequency conditioning is carried out, causing the film thickness H/λ to be less than 0.033. That is, the propagation loss cannot be set at zero.

SUMMARY OF THE INVENTION

To overcome the above-described problems, preferred embodiments of the present invention provide a surface acoustic wave device in which the IDT are produced with high accuracy, the propagation losses in the IDT and the piezoelectric substrate are approximately zero, and the conditioning range for frequency trimming is substantially wider than the surface acoustic wave devices of the prior art.

According to one preferred embodiment of the present invention, a surface acoustic wave device includes a $LiTaO_3$ substrate and an interdigital transducer provided on the $LiTaO_3$ substrate. The interdigital transducer includes at least one of Au, Ag, Ta, Mo, Cu, Ni, Cr, Zn, and W, and the interdigital transducer has a normalized film thickness H/λ of about 0.05 or less so as to excite a shear horizontal wave.

If the interdigital transducer includes Au as a major component, the substrate preferably has Euler angles of approximately (0°, 125°–146°, 0°±5°), and the standardized film thickness H/λ is preferably within the range of about 0.001 to about 0.05.

If the interdigital transducer includes Ag as a major component, the substrate preferably has Euler angles of approximately (0°, 125°–146°, 0°±5°), and the standardized film thickness H/λ is preferably within the range of about 0.002 to about 0.05.

If the interdigital transducer includes Ta as a major component, the substrate preferably has Euler angles of approximately (0°, 125°–140°, 0°±5°), and the standardized film thickness H/λ is preferably within the range of about 0.002 to about 0.05.

If the interdigital transducer includes Mo as a major component, the substrate preferably has Euler angles of approximately (0°, 125°–134°, 0°±5°), and the standardized film thickness H/λ is preferably within the range of about 0.005 to about 0.05.

If the interdigital transducer includes Cu as a major component, the substrate preferably has Euler angles of approximately (0°, 125°–137°, 0°±5°), and the standardized film thickness H/λ is preferably within the range of about 0.003 to about 0.05.

If the interdigital transducer includes Ni as a major component, the substrate preferably has Euler angles of approximately (0°, 125°–133°, 0°±5°), and the standardized film thickness H/λ is preferably within the range of about 0.006 to about 0.05.

If the interdigital transducer includes Cr as a major component, the substrate preferably has Euler angles of approximately (0°, 125°–147°, 0°±5°), and the standardized film thickness H/λ is preferably within the range of about 0.003 to about 0.05.

If the interdigital transducer includes Zn as a major component, the substrate preferably has Euler angles of approximately (0°, 125°–137°, 0°±5°), and the standardized film thickness H/λ is preferably within the range of about 0.003 to about 0.05.

If the interdigital transducer includes W as a major component, the substrate preferably has Euler angles of approximately (0°, 125°–138°, 0°±5°), and the standardized film thickness H/λ is preferably within the range of about 0.002 to about 0.05.

The above-explained surface acoustic wave device is suitable for use in a communication device.

According to preferred embodiments of the present invention, on a $LiTaO_3$ substrate having adequate Euler angles, an IDT is formed from an electrode material having a large specific gravity such as Au, Ag, Ta, Mo, Cu, Ni, Cr, Zn, Pt, W, or other suitable material, at an adequate film thickness, whereby an SH wave having a low propagation loss is excited. Thus, the leaky surface acoustic wave component is significantly reduced. A surface acoustic wave device having a very low propagation loss is produced.

Further, the propagation loss becomes substantially zero even where the film thickness is extremely small. Accordingly, even where the film thickness is altered by trimming IDT to control the frequency, the propagation loss is prevented from deteriorating, in contrast to the conventional surface acoustic wave devices. Thus, the conditioning range of the frequency trimming is much wider than the conventional surface acoustic wave devices.

Other features, characteristics, elements and advantages of the present invention will become apparent from the following description of preferred embodiments thereof with reference to the attached drawings.

DETAILED DESCRIPTION OF PREFERRED EMBODIMENTS

Hereinafter, preferred embodiments of the present invention are explained in detail with reference to the drawings.

Figure 1:
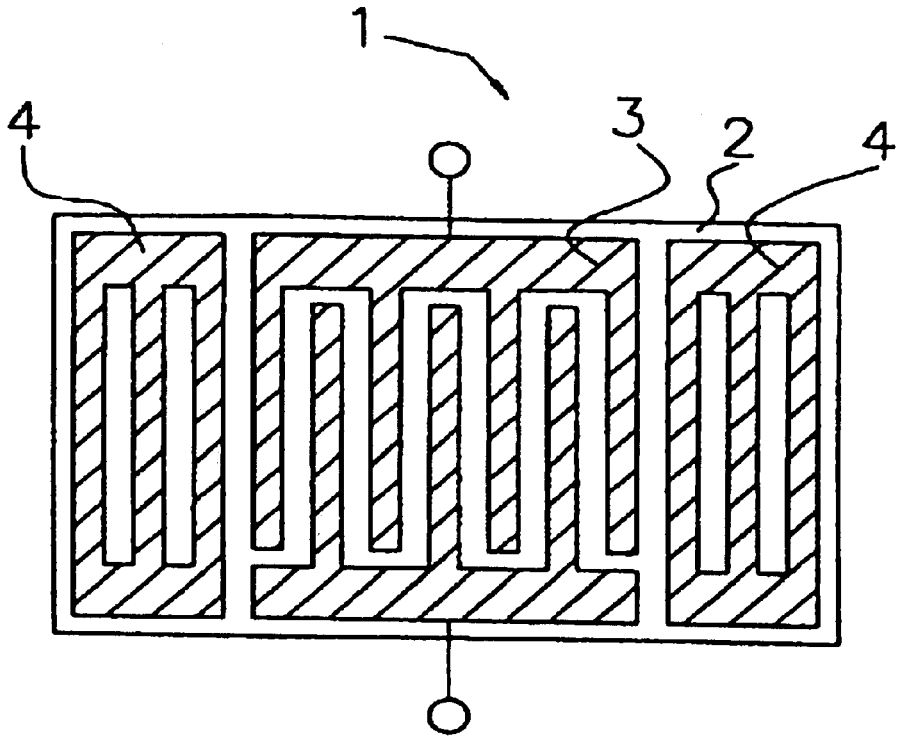
FIG. 1 is a plan view of a surface acoustic wave resonator according to a first preferred embodiment of the present invention.

FIG. 1 is a plan view of a surface acoustic wave resonator in the form of a surface acoustic wave device according to a first preferred embodiment of the present invention.

As seen in FIG. 1, a surface acoustic wave resonator 1 includes at least one IDT 3 and reflectors 4 on both sides of the IDT 3, which are provided on a piezoelectric substrate 2, made of an $LiTaO_3$ single crystal having Euler angles of approximately (0°, 126°, 0°), as an example.

The IDT 3 is configured such that one set of interdigital electrodes including as a major component at least one of Au, Ag, Ta, Mo, Cu, Ni, Cr, Zn, and W are arranged such that the interdigital tooth portions of the respective interdigital electrodes are opposed to each other.

The electrode fingers constituting the interdigital tooth portions of the IDT 3 preferably have a normalized film thickness H/λ of about 5% or less, and particularly, have a normalized film thickness H/λ (electrode thickness/excited SH wavelength)≦0.05. In this range, the electrode fingers are arranged with high accuracy.

Figure 2:
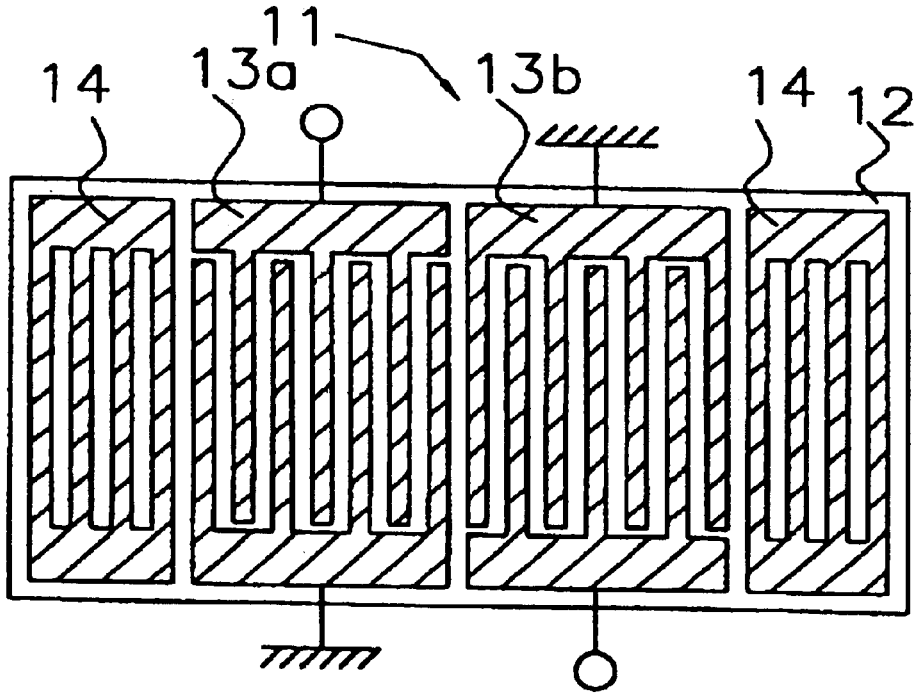
FIG. 2 is a plan view of a longitudinally coupled type surface acoustic wave resonator filter according to a second preferred embodiment of the present invention.

FIG. 2 is a plan view of a longitudinally coupled type surface acoustic wave resonator filter of a surface acoustic wave device according to the second preferred embodiment of the present invention.

As seen in FIG. 2, the longitudinally coupled type surface acoustic wave resonator filter 11 includes at least two IDTs 13a and 13b and reflectors 14 on both sides of the IDTs 13a, 13b, which are provided on a piezoelectric substrate 12 made of an $LiTaO_3$ single crystal having Euler angles of approximately (0°, 126°, 0°), as an example.

The IDTs 13a and 13b are preferably made of an electrode material including as a major component, at least one of Au, Ag, Ta, Mo, Cu, Ni, Cr, Zn, and W, and are configured such that a set of interdigital electrodes are arranged such that the interdigital tooth portions of the respective interdigital electrodes are opposed to each other. Further, the IDTs 13a, 13b are arranged substantially parallel to each other at a desired distance in the surface acoustic wave propagation direction. Also in this preferred embodiment, the electrode fingers constituting the interdigital tooth portion of each of the IDTs 13a and 13b preferably have a normalized film thickness H/λ of approximately 5% or less, and particularly, preferably have a normalized film thickness H/λ (electrode thickness/excited SH wavelength)≦0.05. In this range, the electrode fingers are formed with high accuracy.

Figure 3:
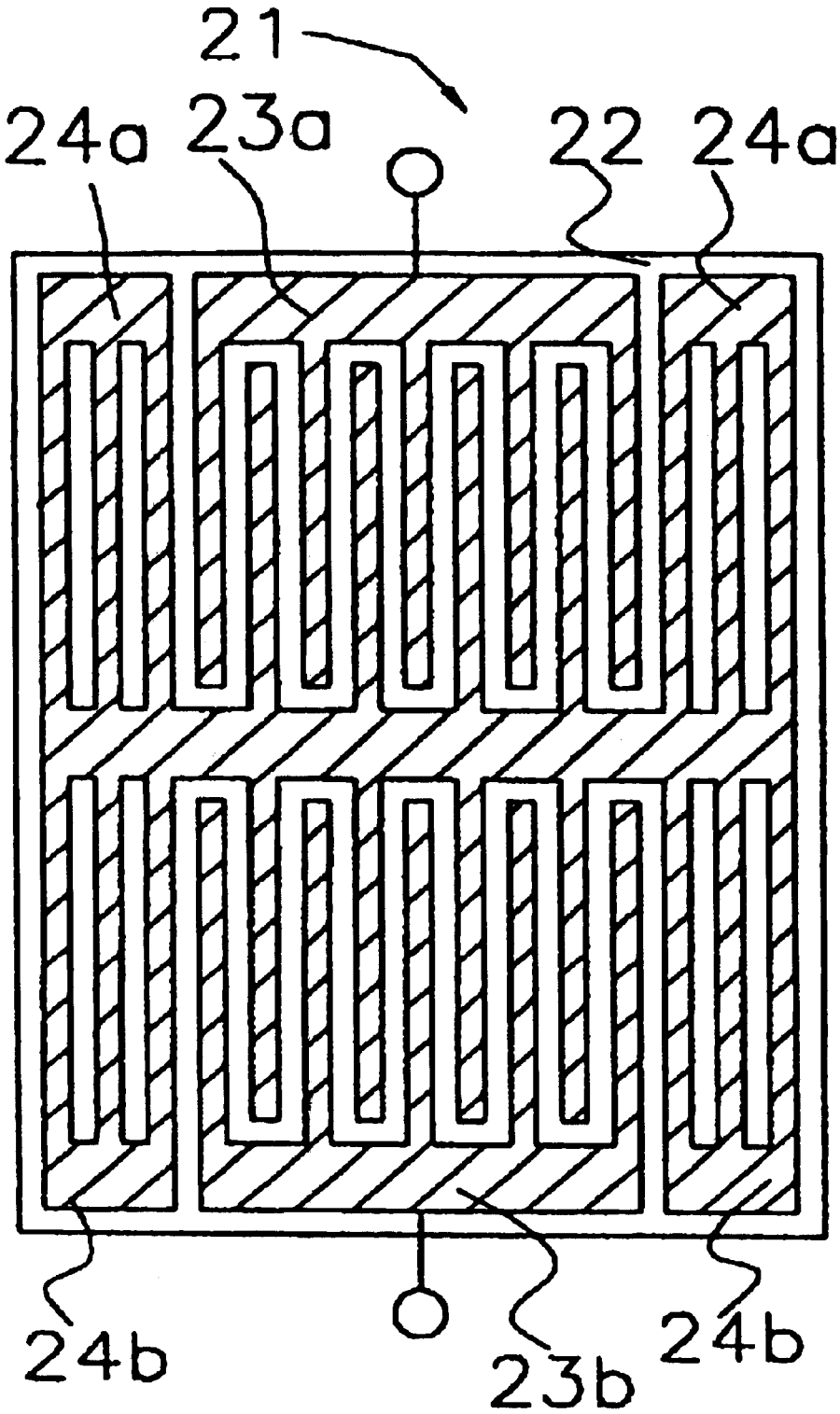
FIG. 3 is a plan view of a transversely coupled type surface acoustic wave resonator filter according to a third preferred embodiment of the present invention.

FIG. 3 is a plan view of a transversely coupled type surface acoustic wave filter as a surface acoustic wave device according to the third preferred embodiment of the present invention.

As seen in FIG. 3, the transversely coupled type surface acoustic wave resonator filter 21 includes at least two IDTs 23a, 23b and reflectors 24a, 24b on each side of the IDTs 23a, 23b, which are provided on a piezoelectric substrate 22 made of an $LiTaO_3$ single crystal having Euler angles of approximately (0°, 126°, 0°), as an example.

The IDTs 23a, 23b are preferably made of an electrode material including as a major component at least one of Au, Ag, Ta, Mo, Cu, Ni, Cr, Zn, and W, and are configured with a set of interdigital electrodes which are provided such that the interdigital tooth portions of the respective interdigital electrodes 23a, 23b are opposed to each other. The IDTs 23a and 23b are arranged in a substantially perpendicular direction relative to the surface acoustic wave propagation direction. In this preferred embodiment, as in the first and second preferred embodiments, the electrode fingers constituting the interdigital tooth portions of each of the IDTs 23a, 23b preferably have a normalized film thickness H/λ of approximately 5% or less, and particularly, preferably have a normalized film thickness H/λ (electrode thickness/excited SH wavelength)≦0.05. In this range, the electrode fingers are formed with high accuracy.

Figure 4:
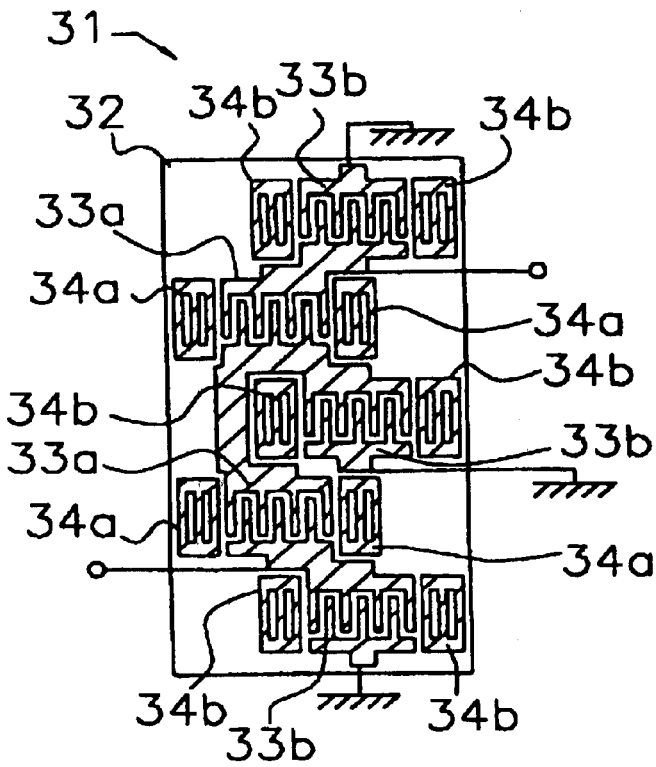
FIG. 4 is a plan view of a ladder type surface acoustic wave filter according to a fourth preferred embodiment of the present invention.

FIG. 4 is a plan view of a ladder type surface acoustic wave filter as a surface acoustic wave device according to the fourth preferred embodiment of the present invention.

As seen in FIG. 4, the ladder type surface acoustic wave filter 31 includes IDTs 33a, 33b and reflectors 34a, 34b on each side of the IDTs 33a, 33b, which are provided on a piezoelectric substrate 32 made of an $LiTaO_3$ single crystal having Euler angles of approximately (0°, 126°, 0°), as an example.

The IDTs 33a, 33b each are preferably made of an electrode material including as a major component at least one of Au, Ag, Ta, Mo, Cu, Ni, Cr, Zn, and W, and have the configuration in which a set of interdigital electrodes are provided such that the interdigital tooth portions of the respective interdigital electrodes are opposed to each other. The IDTs 33a are arranged in the series arm, and the IDTs 33b are arranged in the parallel arm so as to provide a ladder configuration. In this preferred embodiment, as well as in the first, second, and third preferred embodiments, the electrode fingers constituting the interdigital tooth portions of each of the IDTs 33a and 33b preferably have a normalized film thickness H/λ of approximately 5% or less, and preferably have a normalized film thickness H/λ (electrode thickness/excited SH wavelength)≦0.05. In this range, the electrode fingers are formed with high accuracy.

Figure 5:
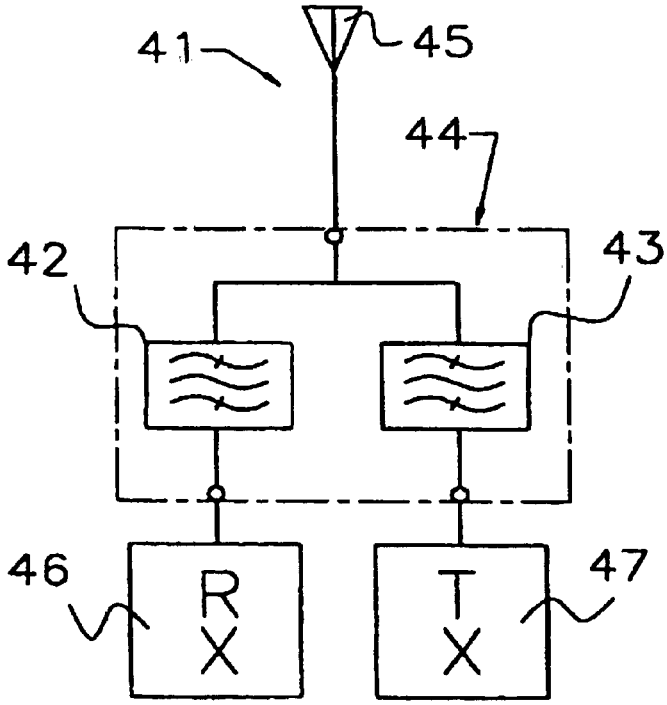
FIG. 5 is a block diagram of a communication device according to fifth and sixth preferred embodiments of the present invention.

Next, fifth and sixth preferred embodiments of the present invention will be described. FIG. 5 is a block diagram showing a sharing device according to a fourth preferred embodiment of the present invention and a communication device according to a fifth preferred embodiment of the present invention.

As seen in FIG. 5, a communication device 41 is configured such that the antenna terminal of a sharing device 44 including a surface acoustic wave filter 42 for reception and a surface acoustic wave filter 43 for transmission is connected to an antenna 45, the output terminal of the sharing device 44 is connected to a reception circuit 46, and the input terminal is connected to a transmission circuit 47. In the sharing device 44, as the reception surface acoustic wave filter 42 and the transmission surface acoustic wave filter 43, any one or a combination of the surface acoustic wave filter 11 to 21 according to the first to fourth preferred embodiments of the present invention is included.

Next, the normalized film thickness H/λ (electrode thickness/excited SH wavelength) will be described with reference to an example.

Figure 6:
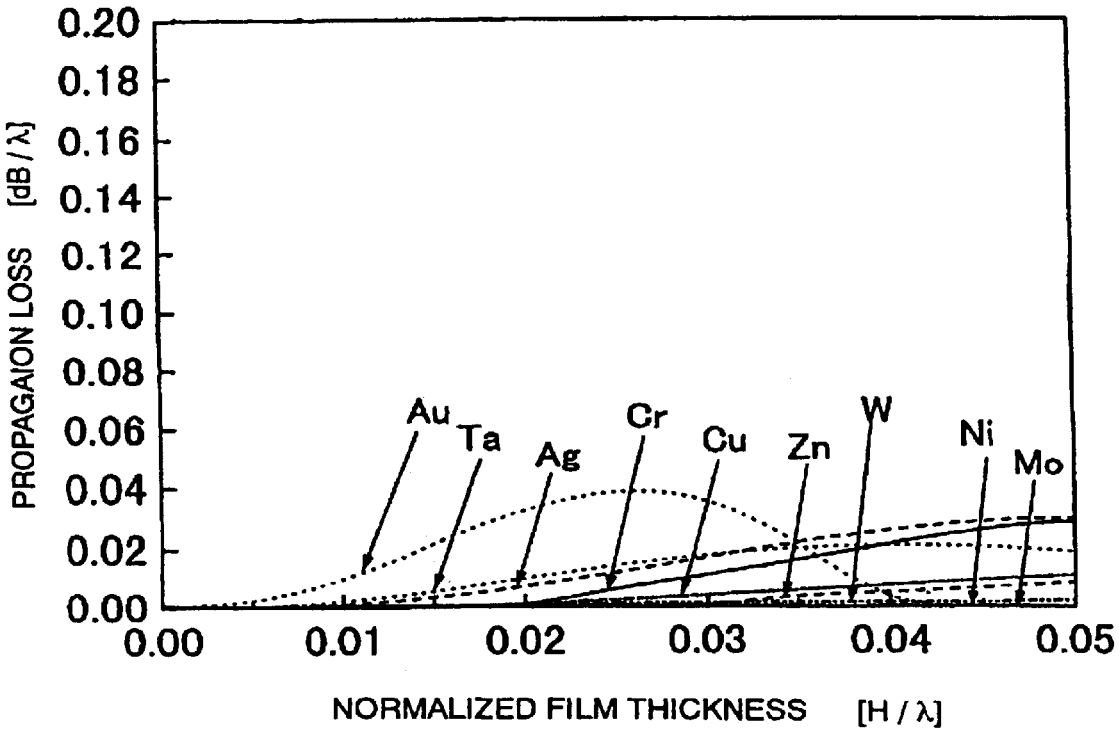
FIG. 6 is a characteristic graph showing the relationship between the normalized film thickness of IDT and the propagation loss when the electrodes of a surface acoustic wave device of preferred embodiments of the present invention are in the electrically short-circuiting state.

FIG. 6 is a graph showing the variation of the propagation loss occurring when the normalized film thickness H/λ (electrode thickness/excited SH wavelength) of the film provided on an $LiTaO_3$ single crystal having Euler angles of approximately (0°, 126°, 0°) is varied between about 0.00 and about 0.05 including the case where not electrode is provided on the piezoelectric substrate (H/λ=0). The electrodes are in the electrical short-circuiting state.

Figure 12:
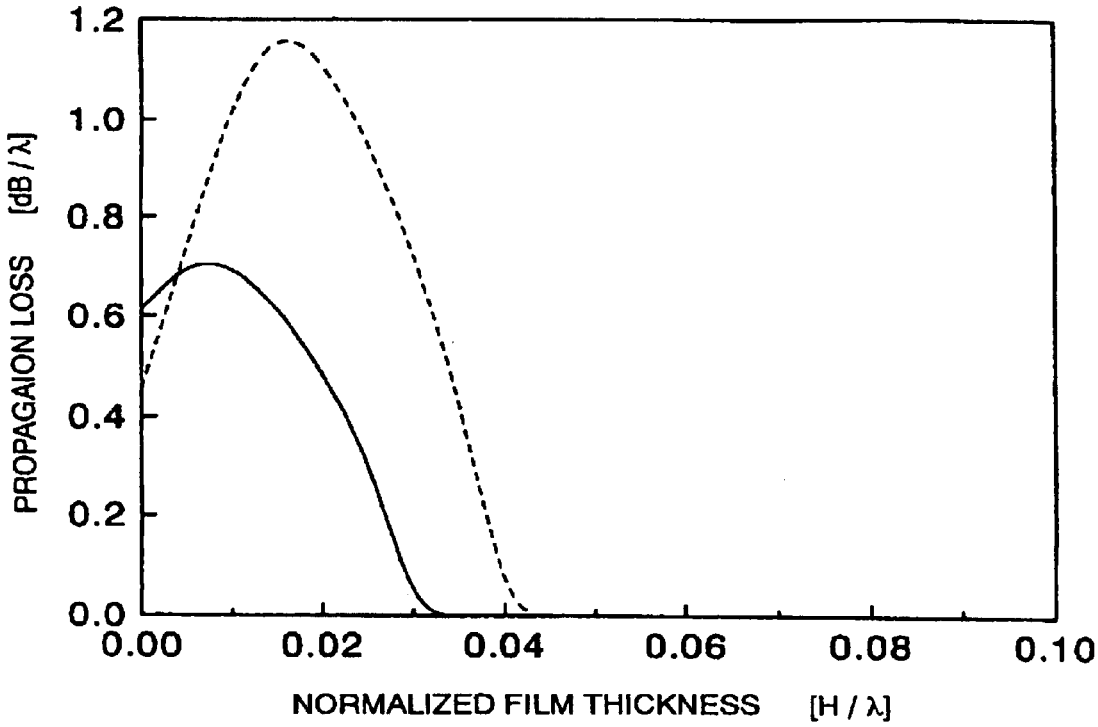
FIG. 12 is a characteristic graph showing the relationship between the normalized film thickness H/λ of IDT of the conventional surface acoustic wave device and the propagation loss on a Y-cut X-propagation $LiTaO_3$.

As seen in FIG. 6, for any of the materials, the propagation loss increases gradually as the thickness increases. However, the propagation loss is substantially less than that of the conventional Love wave filter indicated by the dotted line in FIG. 12. As shown in FIG. 6, regarding Au, the propagation loss is greatest at H/λ=0.025. In this case, the propagation loss is about 0.04 dB/λ. Accordingly, the propagation loss is substantially improved as compared with the propagation loss of 0.32 dB/k at H/λ=0.025 and the maximum propagation loss of 0.7 dB of the conventional Love wave filter indicated by the solid line in FIG. 12.

Figure 7:
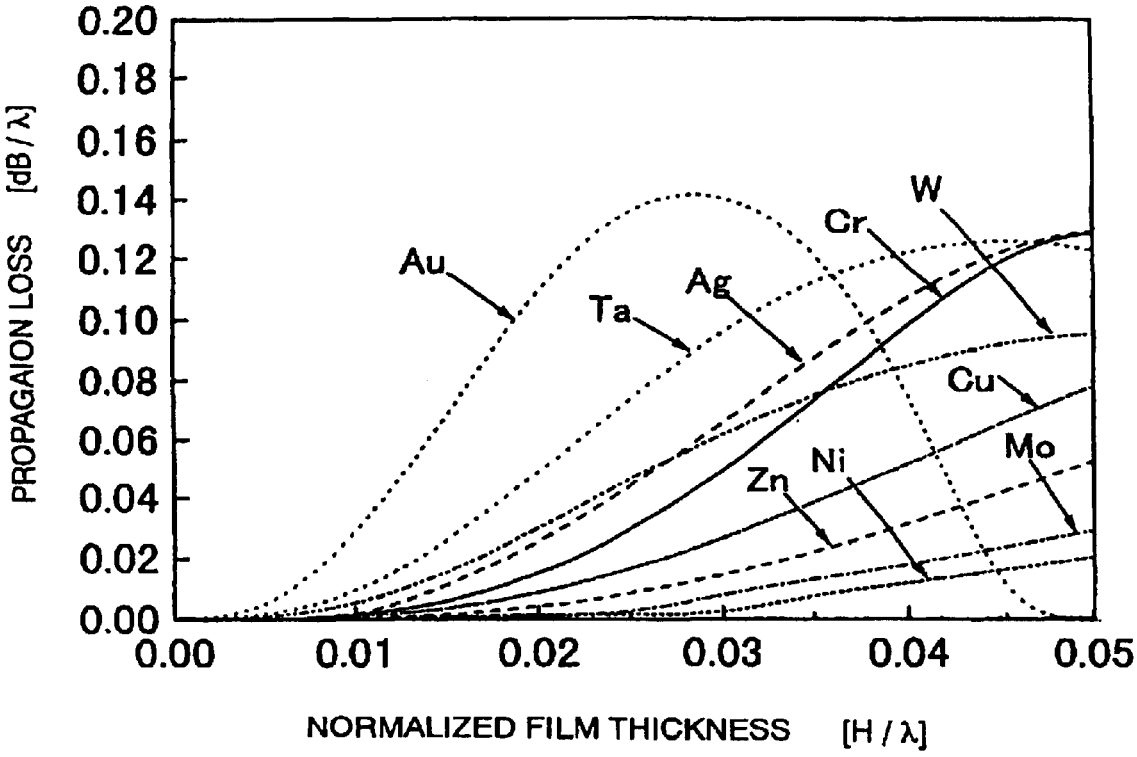
FIG. 7 is a characteristic graph showing the relationship between the normalized film thickness of IDT and the propagation loss when the electrodes of the surface acoustic wave device of preferred embodiments of the present invention are in the electrically open-circuiting state.

FIG. 7 is a graph showing the variation of the propagation loss occurring when the normalized film thickness H/λ (electrode thickness/excited SH wavelength) of the film provided on an $LiTaO_3$ single crystal having Euler angles of approximately (0°, 126°, 0°) is varied between about 0.00 and about 0.05 including the case where no electrode is provided on the piezoelectric substrate. The electrodes are in the electrical open-circuiting state.

As seen in FIG. 7, for any of the materials, the propagation loss increases gradually as the thickness increases. However, the propagation loss is substantially less than that of the conventional Love wave filter indicated by the dotted line in FIG. 12. As shown in FIG. 7, regarding Au, the propagation loss is greatest at H/λ=0.029. In this case, the propagation loss is about 0.142 dB/λ. Accordingly, the propagation loss is substantially improved as compared with the propagation loss of 0.8 dB/λ at H/λ=0.029 and the maximum propagation loss of 1.18 dB of the conventional Love wave filter indicated by the solid line in FIG. 12.

This is because in the conventional LiTaO3 substrate having Euler angles of (0°, −90°, 0°), the Love wave is excited, while in the surface acoustic wave device of preferred embodiments of the present invention, an SH wave having a very low propagation loss is used. Here, Au has been described. The present invention is not restricted to Au. In the case of other materials such as Ag, Ta, Mo, Cu, Ni, Cr, Zn, Pt, W, or other suitable materials, an SH wave is similarly used. Thus, the propagation loss is substantially improved similarly to when Au is used.

The film thickness at which an SH wave can be sufficiently used in the surface acoustic wave device of various preferred embodiments of the present invention varies depending on electrode materials. For example, the H/λ values are at least about 0.001 for Au, at least about 0.002 for Ag, at least about 0.002 for Ta, at least about 0.005 for Mo, at least about 0.003 for Cu, at least about 0.006 for Ni, at least about 0.003 for Cr, at least about 0.003 for Zn, and at least about 0.002 for W. Considering the propagation loss and the electromechanical coupling coefficient, it is suitable that the H/λ values are higher than these values.

Figure 8:
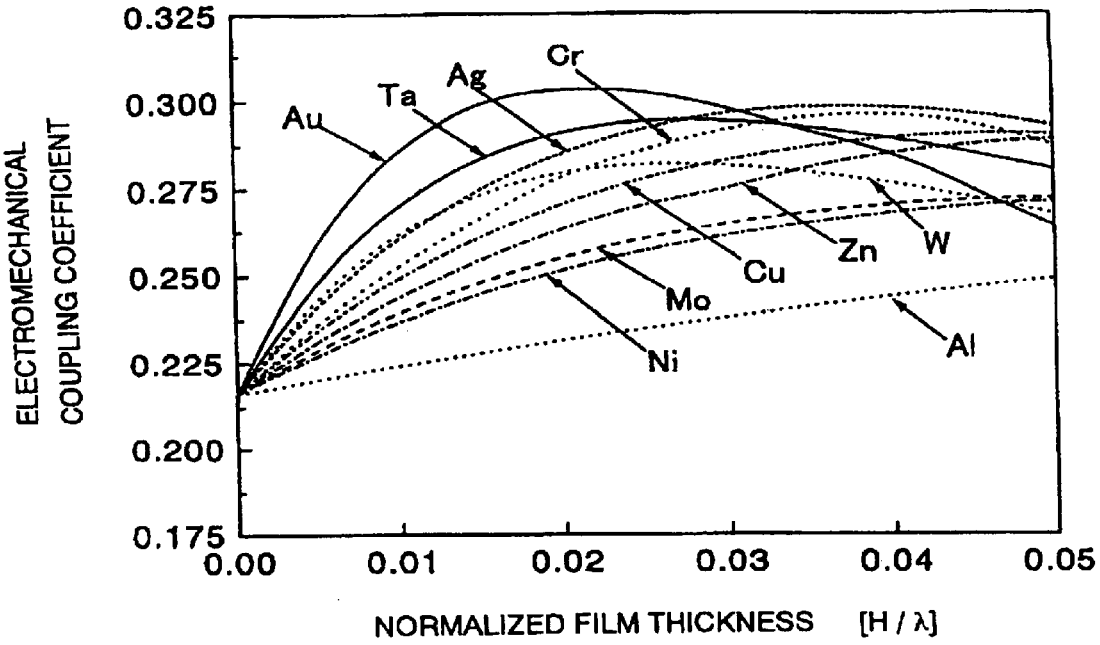
FIG. 8 is a characteristic graph showing the relationship between the normalized film thickness H/λ of IDT of a surface acoustic wave device of preferred embodiments of the present invention and the electromechanical coupling coefficient.

FIG. 8 is a characteristic graph showing the variation of the electromechanical coupling coefficient of each of the electrode materials with various film thicknesses. The substrate materials, the cut angles, and the propagation directions are the same as those of FIGS. 6 and 7. As shown in FIG. 8, for any of the metallic materials, a relatively large electromechanical coupling coefficient is obtained. Further, as seen in FIG. 8, as compared with the electromechanical coupling coefficient of a metallic material having a lower specific density such as Al, that of each of the other metallic materials having a higher specific density is increased.

Figure 9:
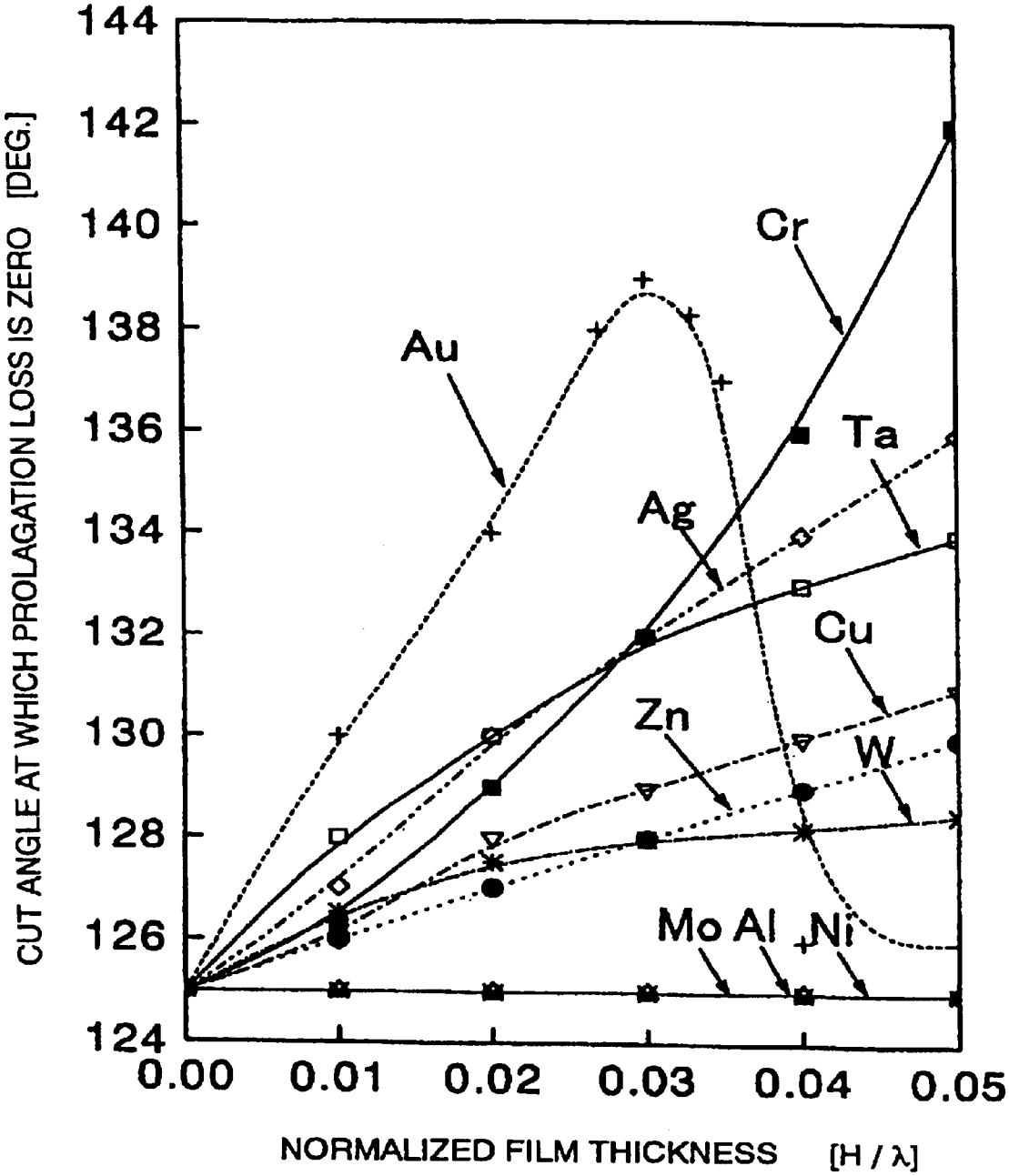
FIG. 9 is a characteristic graph showing the relationship between the normalized film thickness H/λ of IDT and the cut angle at which the propagation loss is zero when the electrodes of a surface acoustic wave device of preferred embodiments of the present invention are in the shortcircuiting state.
Figure 10:
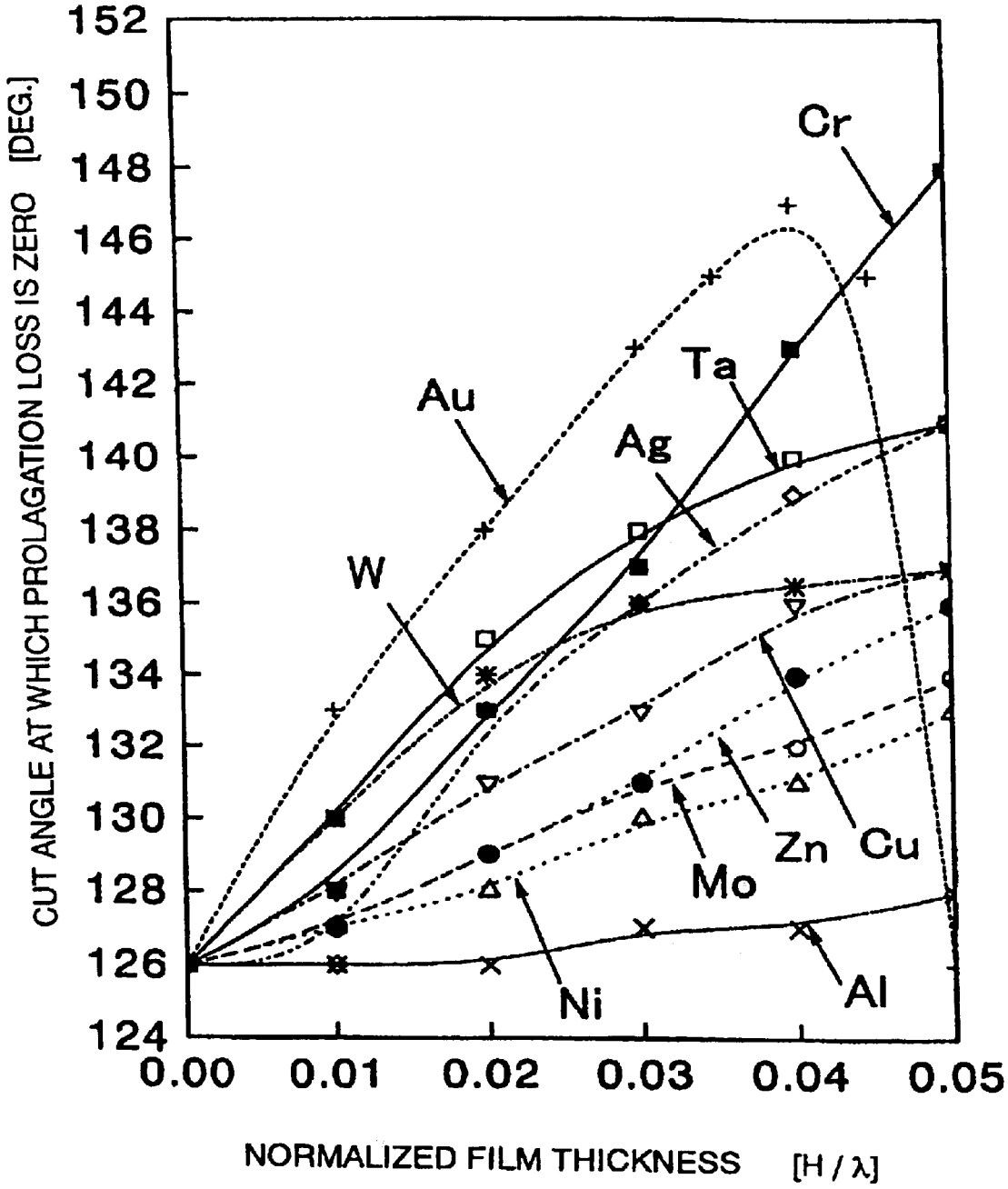
FIG. 10 is a characteristic graph showing the relationship between the normalized film thickness H/λ of IDT and the electromechanical coupling coefficient when the electrodes of a surface acoustic wave device of preferred embodiments of the present invention are in the open-circuiting state.
Figure 11:
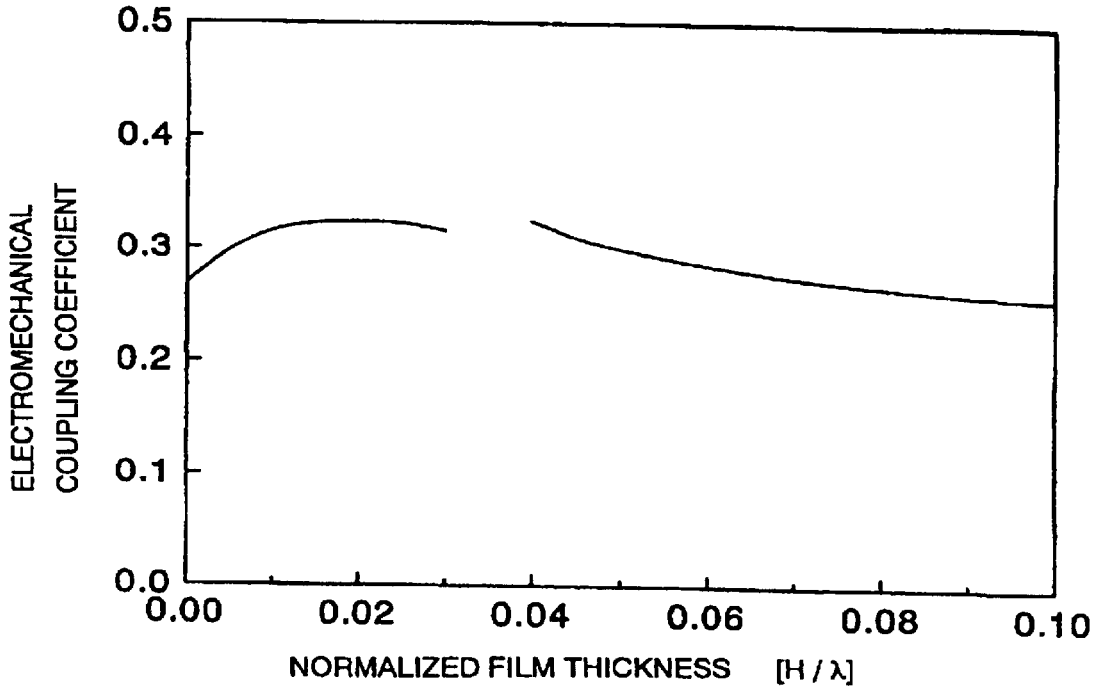
FIG. 11 is a characteristic graph showing the relationship between the normalized film thickness H/λ of IDT and the electromechanical coupling coefficient k on a Y-cut X-propagation $LiTaO_3$.

FIGS. 9 and 10 are characteristic graphs each showing the film thickness and the cut angles θ at which the propagation losses are zero. FIGS. 9 and 10 show the cut angles at which the propagation losses are zero while the electrode are in the electrically short-circuiting state and in the electrically open-circuiting state, respectively. In a practically used IDT, there are areas where an electrode finger is present and where an electrode finger is absent. The IDT has a characteristic, which is between those of shown in FIG. 9 and FIG. 10, depending on the metallization ratio. The cut angle is set (0°, θ, 0°±5°) according to the Euler angle indication system of (ϕ, θ, ψ) where θ is varied, and ϕ represents a propagation direction, and the error of about ±5° is of such a degree as is within the tolerance of propagation loss.

In FIGS. 9 and 10, it is seen that in the case of Au used as the electrodes of IDT, the cut angle at which the propagation loss of 0 is attained is approximately (0°, 125°–146°, 0°±5°) according to the Euler angle indication system of (ϕ, θ, ψ).

Further, it is seen that in the case of Ag used as the electrodes of IDT, the cut angle at which the propagation loss of 0 is attained is approximately (0°, 125°–140°, 0°±5°) according to the Euler angle indication system of (ϕ, θ, ψ).

It is seen that in the case of Ta used as the electrodes of IDT, the cut angle at which the propagation loss of 0 is attained is approximately (0, 125°–140°, 0°±5°) according to the Euler angle indication system of (ϕ, θ, ψ).

It is seen that in the case of Mo used as the electrodes of IDT, the cut angle at which the propagation loss of 0 is attained is approximately (0°, 125°–134°, 0°±5°) according to the Euler angle indication system of (ϕ, θ, ψ).

It is seen that in the case of Cu used as the electrodes of IDT, the cut angle at which the propagation loss of 0 is attained is approximately (0°, 125°–137°, 0°±5°) according to the Euler angle indication system of (ϕ, θ, ψ).

It is seen that in the case of Ni used as the electrodes of IDT, the cut angle at which the propagation loss of 0 is attained is approximately (0°, 125°–133°, 0°±5°) according to the Euler angle indication system of (ϕ, θ, ψ).

It is seen that in the case of Cr used as the electrodes of IDT, the cut angle at which the propagation loss of 0 is attained is approximately (0°, 125°–147°, 0°±5°) according to the Euler angle indication system of (ϕ, θ, ψ).

It is seen that in the case of Zn used as the electrodes of IDT, the cut angle at which the propagation loss of 0 is attained is approximately (0°, 125°–137°, 0°±5°) according to the Euler angle indication system of (ϕ, θ, ψ).

It is seen that in the case of W used as the electrodes of IDT, the cut angle at which the propagation loss of 0 is attained is approximately (0°, 125°–138°, 0°±5°) according to the Euler angle indication system of (ϕ, θ, ψ).

Accordingly, by using a $LiTaO_3$ substrate having a cut angle shown in FIGS. 9 and 10 and an electrode material having the above-described film thickness, a surface acoustic wave device having a propagation loss of substantially zero is produced.

Furthermore, electromechanical coupling factors greater than that of Al are obtained, which can realize surface acoustic wave filters having a smaller insertion loss.

In the first to sixth preferred embodiments of the present invention, the surface acoustic wave device having reflectors is described. The present invention is not restricted to such a device, and is applicable to a surface acoustic wave device having no reflectors.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

[1. A surface acoustic wave device comprising:

a $LiTaO_3$ substrate; and an interdigital transducer provided on the $LiTaO_3$ substrate, said interdigital transducer containing as a major component at least one of Au, Ag, Ta, Mo, Cu, Ni, Cr, Zn, and W; wherein said interdigital transducer has a normalized film thickness H/λ within a range of approximately 0.001 to approximately 0.05 so as to excite a shear horizontal wave.]

2. [A surface acoustic wave device according to claim 1, wherein said interdigital transducer includes Au as a major component,] *A surface acoustic wave device comprising:*

*a $LiTaO_3$ substrate; and*

*an interdigital transducer provided on the $LiTaO_3$ substrate, said interdigital transducer containing Au as a major component; wherein*

*said interdigital transducer has a normalized film thickness H/λ within a range of approximately 0.001 to approximately 0.05 so as to excite a shear horizontal wave; and* said substrate has Euler angles of approximately (0°, 125°–146°, 0°±5°).

3. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.002 to approximately 0.05 so as to excite a shear horizontal wave;* said interdigital transducer includes Ag as a major component[.]; *and* said substrate has Euler angles of approximately (0°, 125°–140°, 0°±5°)[, and said normalized film thickness H/λ is within the range of approximately 0.002 to 0.05].

4. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.002 to approximately 0.05 so as to excite a shear horizontal wave;* said interdigital transducer includes Ta as a major component[.]; *and* said substrate has Euler angles of approximately (0°, 125°–140°, 0°±5°)[, and said normalized film thickness H/λ is within the range of approximately 0.002 to 0.05].

5. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.005 to approximately 0.05 so as to excite a shear horizontal wave;* said interdigital transducer includes Mo as a major component[.]; *and* said substrate has Euler angles of approximately (0°, 125°–134°, 0°±5°)[, and said normalized film thickness H/λ is within the range of approximately 0.005 to 0.05].

6. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.003 to approximately 0.05 so as to excite a shear horizontal wave;* said interdigital transducer includes Cu as a major component[.]; *and* said substrate has Euler angles of approximately (0°, 125°–137°, 0°±5°)[, and said normalized film thickness H/λ is within the range of approximately 0.003 to 0.05].

7. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.006 to approximately 0.05 so as to excite a shear horizontal wave;* said interdigital transducer includes Ni as a major component[.]; *and* said substrate has Euler angles of approximately (0°, 125°–133°, 0°±5°)[, and said normalized film thickness H/λ is within the range of approximately 0.006 to 0.05].

8. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.003 to approximately 0.05 so as to excite a shear horizontal wave;* said interdigital transducer includes Cr as a major component[.]; *and* said substrate has Euler angles of approximately (0°, 125°–147°, 0°±5°)[, and said normalized film thickness H/λ is within the range of approximately 0.003 to 0.05].

9. [A surface acoustic wave device according to claim 1, wherein] *A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.003 to approximately 0.05 so as to excite a shear horizontal wave;* said interdigital transducer includes Zn as a major component[.]; *and* said substrate has Euler angles of approximately (0°, 125°–138°, 0°±5°)[, and said normalized film thickness H/λ is within the range of approximately 0.003 to 0.05].

10. [A surface acoustic wave device according to claim 1, wherein]*A surface acoustic wave device comprising:*

*a $LiTaO_3$ substrate; and*

*an interdigital transducer provided on the $LiTaO_3$ substrate; wherein*

*said interdigital transducer has a normalized film thickness H/λ within a range of approximately 0.002 to approximately 0.05 so as to excite a shear horizontal wave;* said interdigital transducer includes W as a major component[.]; *and* said substrate has Euler angles of approximately (0°, 125°–138°, 0°±5°)[, and said normalized film thickness H/λ is within the range of approximately 0.002 to 0.05].

[11. A communication device including the surface acoustic wave device according to claim 1.]

12. A communication device including the surface acoustic wave device according to claim 2.

13. A communication device including the surface acoustic wave device according to claim 3.

14. A communication device including the surface acoustic wave device according to claim 4.

15. A communication device including the surface acoustic wave device according to claim 5.

16. A communication device including the surface acoustic wave device according to claim 6.

17. A communication device including the surface acoustic wave device according to claim 7.

18. A communication device including the surface acoustic wave device according to claim 8.

19. A communication device including the surface acoustic wave device according to claim 9.

20. A communication device including the surface acoustic wave device according to claim 10.

21. *A surface acoustic wave device comprising:*

*a $LiTaO_3$ substrate; and*

*an interdigital transducer provided on the $LiTaO_3$ substrate, said interdigital transducer containing as a*

*major component at least one of Au, Ag, Ta, Mo, Cu, Ni, Cr, Zn, and W; wherein*

*said interdigital transducer has a normalized film thickness H/λ within a range of approximately 0.001 to approximately 0.05;*

*the substrate has Euler angles of approximately (0°, 136° to 147°, 0°±5°).*

*22. A surface acoustic wave device according to claim 21, wherein the substrate has Euler angles of approximately (0°, 136° to 137°, 0°±5°).*

*23. A surface acoustic wave device according to claim 21, wherein the substrate has Euler angles of approximately (0°, 136.5°, 0°±5°).*

*24. A surface acoustic wave device according to claim 21, wherein the normalized thickness H/λ is within a range of approximately 0.03 to approximately 0.05.*

*25. A surface acoustic wave device according to claim 21, wherein the normalized thickness H/λ is approximately 0.04.*

*26. A surface acoustic wave device according to claim 21, wherein the major component is Cu;*

*the normalized thickness H/λ is within a range of approximately 0.03 to approximately 0.05; and*

*the substrate has Euler angles of approximately (0°, 136° to 137°, 0°±5°).*

*27. A surface acoustic wave device according to claim 21, wherein the major component is Cu;*

*the normalized thickness H/λ is approximately 0.04; and*

*the substrate has Euler angles of approximately (0°, 136° to 137°, 0°±5°).*

*28. A surface acoustic wave device according to claim 21, wherein the major component is Cu;*

*the normalized thickness H/λ is within a range of approximately 0.03 to approximately 0.05; and*

*the substrate has Euler angles of approximately (0°, 136.5°, 0°±5°).*

*29. A surface acoustic wave device according to claim 21, wherein the major component is Cu;*

*the normalized thickness H/λ is approximately 0.04; and*

*the substrate has Euler angles of approximately (0°, 136.5°, 0°±5°).*

*30. A surface acoustic wave device according to claim 21, wherein the major component is Cu; and*

*the substrate has Euler angles of approximately (0°, 136° to 137°, 0°±5°).*

*31. A surface acoustic wave device according to claim 21, wherein the major component is Cu; and*

*the substrate has Euler angles of approximately (0°, 136.5°, 0°±5°).*

* * * * *